US006838391B2

(12) United States Patent
Härle (10) Patent No.: US 6,838,391 B2
(45) Date of Patent: Jan. 4, 2005

(54) METHOD OF SEMICONDUCTOR PROCESSING INCLUDING FLUORIDE

(75) Inventor: Volker Härle, Waldetzenberg (DE)

(73) Assignee: Osram Opto Semiconductors GmbH & Co. oHG, Regensburg (DE)

( * ) Notice: Subject to any disclaimer, the term of this patent is extended or adjusted under 35 U.S.C. 154(b) by 0 days.

(21) Appl. No.: 10/625,118

(22) Filed: Jul. 22, 2003

(65) Prior Publication Data

US 2004/0053513 A1 Mar. 18, 2004

Related U.S. Application Data

(62) Division of application No. 09/722,461, filed on Nov. 28, 2000, which is a continuation of application No. PCT/DE99/01556, filed on May 25, 1999.

(30) Foreign Application Priority Data

May 29, 1998 (DE) .......................................... 198 24 142

(51) Int. Cl.[7] ...................... H01L 21/302; H01L 21/461
(52) U.S. Cl. ........................ 438/736; 438/743; 438/744; 438/756; 438/757
(58) Field of Search ............................ 438/28, 29, 31, 438/32, 34, 41, 44, 46, 694, 700, 703, 734, 736, 743, 744, 756, 757, 778, 787, 907, 908

(56) References Cited

U.S. PATENT DOCUMENTS

| 4,415,404 | A | 11/1983 | Riegl |
| 4,614,564 | A | 9/1986 | Sheldon et al. |
| 4,816,098 | A | 3/1989 | Davis et al. |
| 4,980,312 | A | 12/1990 | Harris et al. |
| 5,268,069 | A | 12/1993 | Chapple-Sokol et al. |
| 5,418,183 | A | 5/1995 | Joyner et al. |
| 5,668,038 | A | 9/1997 | Huang et al. |
| 5,702,569 | A | 12/1997 | Park et al. |
| 5,937,273 | A | 8/1999 | Fujii et al. |
| 6,140,247 | A | 10/2000 | Muraoka et al. |

FOREIGN PATENT DOCUMENTS

| EP | 0681315 | 6/2000 |
| EP | 0746011 | 10/2001 |
| JP | 01270287 | 10/1989 |
| JP | 02-046407 | 2/1990 |
| JP | 5006880 | 1/1993 |
| JP | 5160085 | 6/1993 |
| JP | 6224153 | 5/1994 |
| JP | 07202317 | 8/1995 |

OTHER PUBLICATIONS

B. Henle, et, al., "*In Situ Selective Area Etching and Movpe Regrowth Of GainsAs–InP ON InP Substrates,*"*Int. Conf. On Indium Phosphide & Rel. Materials, U.S. NY; IEEE, Bd. CONF 4, S. pp. 159–162.*

(List continued on next page.)

*Primary Examiner*—Van Thu Nguyen
*Assistant Examiner*—Beth E. Owens
(74) *Attorney, Agent, or Firm*—Fish & Richardson P.C.

(57) ABSTRACT

A method for the production of semiconductor components which includes applying masking layers and components on epitaxial semiconductor substrates within the epitaxy reactor without removal of the substrate from the reactor. At least one of the masking layers is HF soluble such that a gas etchant may be introduced within the reactor so as to etch a select number and portion of masking layers. This method may be used for production of lateral integrated components on a substrate wherein the components may be of the same or different type. Such types include electronic and opto-electronic components. Numerous masking layers may be applied, each defining particular windows intended to receive each of the various components. In the reactor, the masks may be selectively removed, then the components grown in the newly exposed windows.

24 Claims, 5 Drawing Sheets

OTHER PUBLICATIONS

Sugano, Hikaru, "Semiconductor Laser Manufacturing Method", Oct. 27, 1989, pp. 1–6.

JP–61 210687 Patent Abstracts of Japan, Venoffentlichung, Sep. 8, 1986.

G.B., Burns, "Lo–Temperature Native Oxide Removal From Silicon Using Nitrogen Trifluoride Prior To Low–Temperature Silicon Expitaxy", Appl. Phys. Lett. 53 (15), Oct. 1988 pp 1423–1425.

T. Aoyama et al. "Silicon Surface Cleaning Using Photo excited Fluroing Gas Diluted With Hydrogen", J. Electrochem. Soc. vol. 140, No. 6, Jun. 1993 pp 1704–1708.

K. Ozasa et al., "Deposition Of Thin Indium Oxide Film and Its Application To Selective Epitaxy For In Situ Procesing" Thin Solid Films, BD. 246, NR. 1/02, 1994, S. 58–64, XP000453839.

J.P. Harbinson et al., "Tungsten Patterning As A Technique For Selective Area III–V MBE Growth", J. Vac. Sci. Technol. B3(2) Mar./Apr. 1995.

JP 02–046407, Patent Abstracts of Japan, Veroffentlicung: Feb. 2, 1990, Anmeldung: Aug. 5, 1988.

S. Yoshida et al., "Selective–Area Epitaxy Of GaAs Using A New Mask Material For In Situ Processes", Inst. Phys. Conf. Ser. No. 129: Chapter 3, 1992, S–49–54, XP000366199.

P.J. O'Sullivan, et al., "Selective–Area Epitaxy For GaAs–on–InP Optoelectronic Integrated Circuits (OEICs)", Semiconductor Sci. & Technol. 8, No. 6, Jun. 1993, pp 1179–1185.

Whidden T.K. et al.; "Catalyzed HF Vapor Ethcing Of Silicon Dioxide Für Micro–and Nanolithographic Masks"; Apr. 1995; J. Electrochem Soc., vol. 142, No. 4, pp 1199–1204.

Torek K. et al.; "Reduced Pressure Etching Of Thermal Oxides In Anhydrous HF/Alcoholic Gas Mixtures"; Apr. 1995; J. Electrochem Soc., vol. 142, No. 4, pp 1322–1326.

Wong M. et al., "Characterization Of Wafer Cleaning And Oxide And Oxide Etching Using Vapor–Phase Hydrgoen Fluoride"; Jun. 1991, J. Electrochem, Soc., vol. 138, No. 6, pp 1799–1802.

METHOD OF SEMICONDUCTOR PROCESSING INCLUDING FLUORIDE

CROSS-REFERENCE TO RELATED APPLICATIONS

This application is a divisional application of U.S. application Ser. No. 09/722,461, filed on Nov. 28, 2000, which is a continuation of international application PCT/DE99/01556, filed May 25, 1999, which designated the United States, the entire disclosures of which are incorporated herein by reference.

BACKGROUND OF THE INVENTION

1. Field of the Invention

The present invention relates to a method for manufacturing semiconductor components wherein HF (hydrogen fluoride) soluble masking material is used. The components may be optoelectronic or electronic semiconductor components or laterally integrated semiconductor components wherein electrical and optoelectronic semiconductor components are individually used or combined.

2. Description of Related Art

It is known in the art that HF soluble layers on an epitaxial substrate, such as a semiconductor substrate, may be chemically (wet or dry) removed outside of an epitaxial reactor. By this method, laterally integrated components may be produced by selective epitaxy or heteroepitaxy.

In selective epitaxy, HF soluble layers are use for masking. Select layers are grown in the epitaxy reactor and thereafter, masked areas are chemically (wet or dry) removed outside of the reactor. For further integrations, additional lithographic steps would be necessary.

In heteroepitaxy, direct semiconductors (connection semiconductors) are applied on a silicon substrate. The natural oxide of the silicon, $SiO_2$, which is created by the contact of the substrate with oxygen, produces considerable problems. To remove this $SiO_2$ layer the substrate needs to be exposed to high temperatures in the order of approximately 900° C.

As such, in both methods, the substrate is removed from the reactor and exposed to ambient air. Accordingly, the substrate may be exposed to uncontrolled contamination. By multiple insertions and removals of the substrate into and from the reactor, the above processes become susceptible to faults, the gain of functional components decreases, and the production costs increase. For example, in heteroepitaxy electrical and optoelectrical components are integrated. In general, the electrical components already exist on the semiconductor substrate prior to the application of the optoelectronic components. During the high temperature step of removing the natural oxide of the silicon, at least the electrical components may be damaged.

BRIEF SUMMARY OF THE INVENTION

It is an object of the present invention to avoid, as much as possible, the removal of the semiconductor substrate from the epitaxy reactor. It is a further object, to avoid as much as possible the high temperature steps discussed above. It is still further object to provide a method, which can be implemented so as to enable mass production at reasonable engineering effort and expense and with maximally replicable component characteristics.

With the foregoing and other objects in view, there is provided in accordance with the invention, a method for producing semiconductor components, comprising the steps of: applying at least one HF soluble masking layer on an epitaxy substrate such that said masking layer defines at least one epitaxy first window wherein said masking layer is not applied; epitaxially growing at least one semiconductor layer in at least one of said first window, said epitaxial growth occurring within an epitaxy reactor; and removing said masking layer through use of an etchant, said etchant comprising at least a fluoride, and said removal occurring within said reactor.

The present invention also comprises a method of producing laterally integrated semiconductor components, comprising the steps of: applying a first semiconductor component on an epitaxial substrate; layering a first HF soluble mask over said first semiconductor component and epitaxial substrate, said mask defining windows on said substrate for application of other semiconductor components; and applying second semiconductor components in said windows.

The present invention further comprises a method for producing semiconductor components comprising the steps of: applying at least one first semiconductor component on an epitaxial substrate; applying n number of masking layers on said epitaxial substrate and the first semiconductor component, wherein each of said masking layers defines a window for application of other semiconductor components and wherein n is a natural number; etching at least one of said n number of masking layers; and applying at least one other semiconductor component in at least one of said windows defined by said etched masking layer.

The corroding of the HF soluble layers takes place in the epitaxy reactor by induction of hydrogen fluoride (HF) or an unstable fluoride combination. The unstable fluoride combination is marked thereby, that it disintegrates by light stimulation or by warming to at least one hundred degrees Celsius as well as it releases hydrogen fluoride. With some fluoride combinations, other or additional gases, so called carrier gases, may be introduced. Usually $H_2$, N or Argon is used. The introduction of theses carrier gases is necessary fo unstable fluoride combinations, but not for hydrogen fluoride. Because many epitaxy reactors consist of quartz glass, which reacts with the corrosive fluoride, the reactor walls must be protected from such corrosive gas. This is done preferably by cooling the reactor walls so as to reduce the reactivity of these thermally unstable gases.

Different components can be produced through the use of different HF soluble masking materials, each with different layer thicknesses. Herein, the different HF soluble masking materials are lifted away in different etching steps without interrupting the process as a whole. As such, during different layering steps, different epitaxy materials can applied epitaxially. With the use of suitable masking defining components, later lithographic processes can be advantageously reduced. In addition, costs savings may be incurred by avoiding the steps of removing and inserting the substrate into the epitaxy reactor.

According to the method of the present invention, already preprocessed semiconductor components (e.g. electrical components) may be connected with more semiconductor components of another type (e.g. optoelectronic components). To facilitate this advantage, already existing semiconductors components may be selectively covered with a thick HF soluble layer. Areas intended for optoelectronic semiconductor components would then be covered with a thin HF soluble layer. By an in situ etching step, the areas for the optoelectronic components would be exposed, while the electrical components remain protected by a thinner layer of HF soluble masking material.

The invention will now be set out in greater detail below with reference to exemplary embodiments shown in the drawings.

DETAILED DESCRIPTION OF THE INVENTION

Figure 1A:
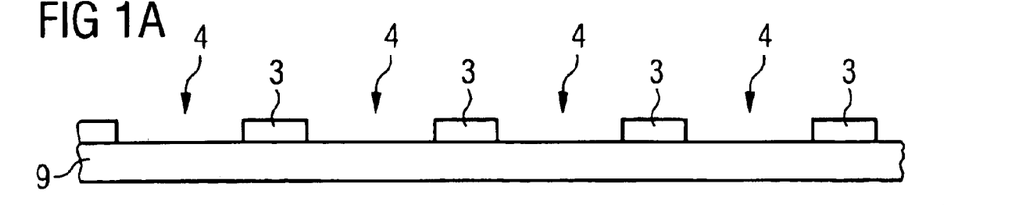
FIGS. 1a–1c depict a schematic presentation of a first embodiment of the present invention.
Figure 1B:
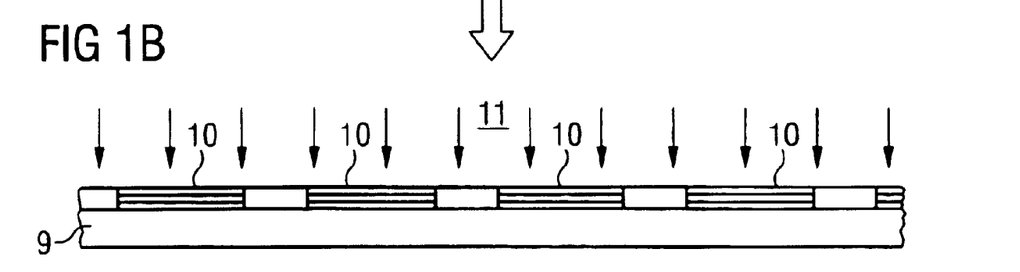
Figure 1C:
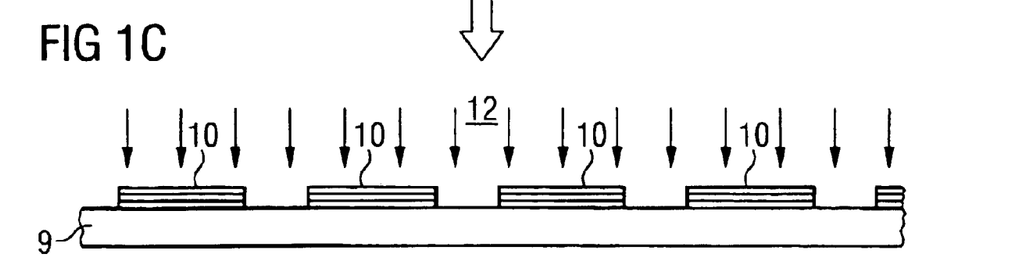

Reference is now made to the figures of the drawings in which elements at are identical or function identically are identified by the same reference numerals throughout. Prior to the start of any of the methods to be described below, it is within the scope of each to clean the epitaxial substrate, prior to any applications, with the introduction of at least one fluoride based hydrogen fluoride soluble layer. The cleaning may occur within or outside the epitaxy reactor. In FIGS. 1a–1c, an epitaxy substrate 9 is depicted with a masking layer 3 comprising one of HF soluble material. Such material may be $SiO_2$ or $Si_{88}$. The masking layer 3 defines windows 4. The substrate, if not already present, is placed in an epitaxy reactor. Herein and as depicted in FIG. 1b, a layering sequence 10 is commenced in the windows 4. The sequence may be a semiconductor laser effected by MOVPE (metal organic vapor phase epitaxy). The application step is further indicated by arrows 11. Next and as depicted in FIG. 1c, the masking layer 3 is removed by etching 12 of a fluoride combination (for example HF), which may be introduced in the epitaxy reactor after the epitaxy. The process temperature lies preferably between 50 and 500° C. The substrate 9 or wafer is now ready for additional processing.

Figure 2A:
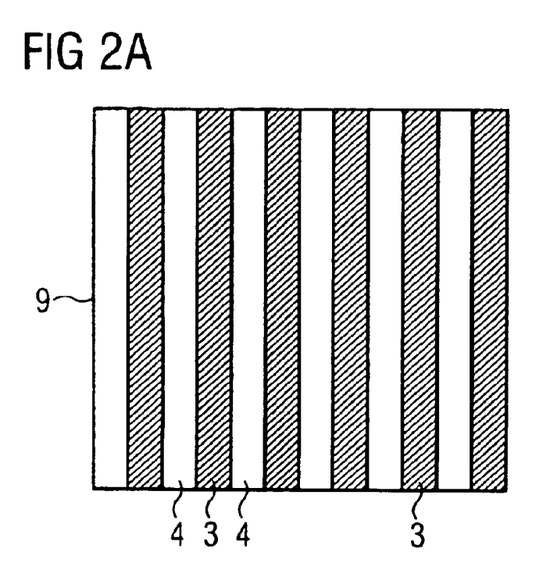
FIGS. 2a–2d depict a schematic presentation of a second embodiment.
Figure 2B:
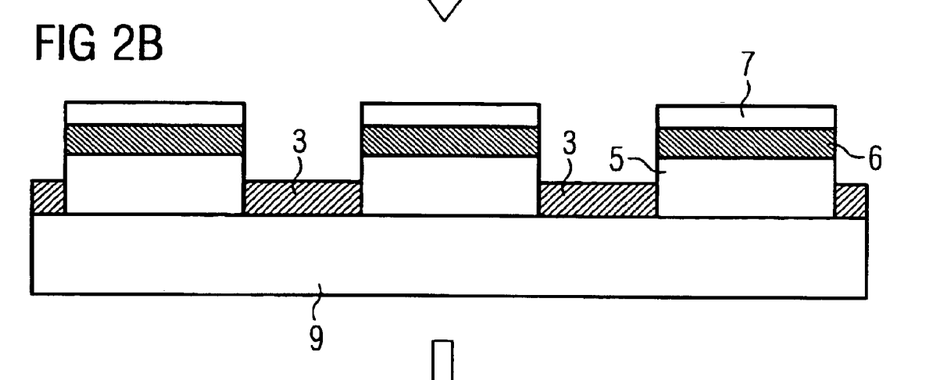
Figure 2C:
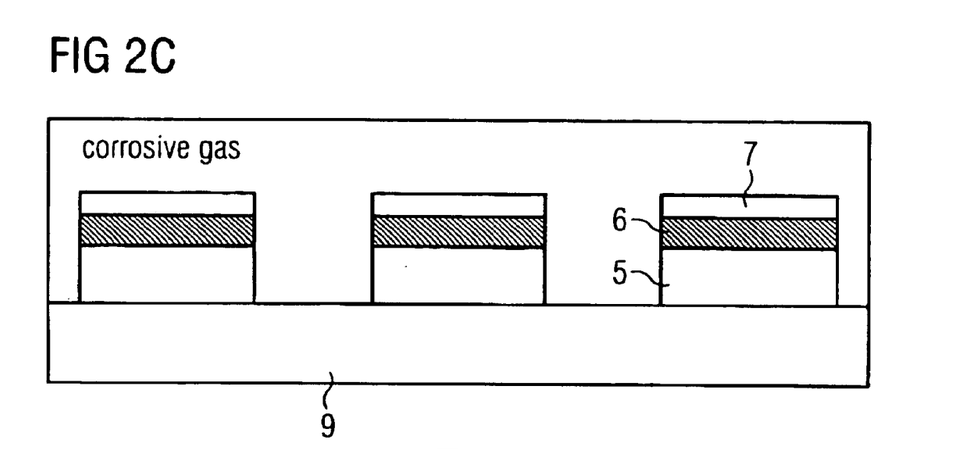
Figure 2D:
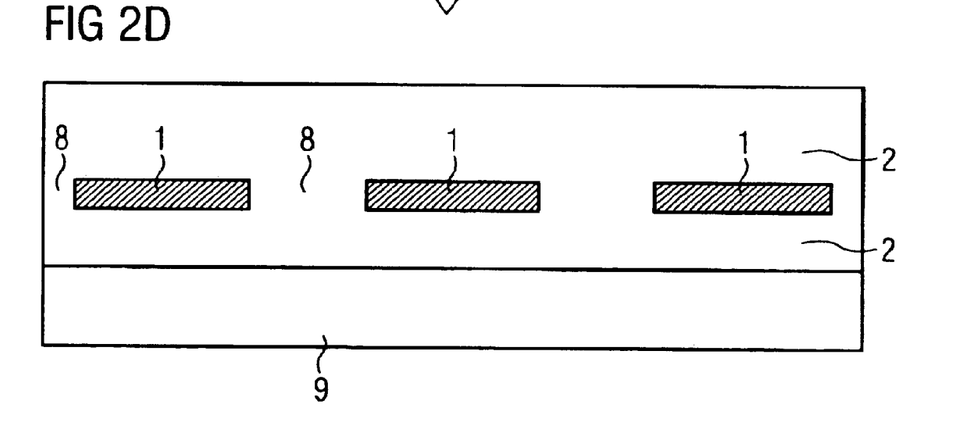

FIGS. 2a–2d depict procedural steps according to the present invention undertaken to produce a laser structure having an active area 1, a first vertical wave guide 2, and a second horizontal wave guide 8. As a first step and as depicted in FIG. 2a, a HF soluble masking layer 3 (e.g. be $SiO_2$, $Si_8N_8$) is directly applied onto an epitaxy substrate 9. The masking layer 3 defines windows 4. Next and as depicted in FIG. 2b, in an epitaxy reactor a first wave-guide layer 5 is applied in windows 4. An active area layer 6 is applied thereon. Then a second wave guide layer 7 is applied thereon. The first and second wave-guide layers 5 and 7 form at least one part of the vertical wave-guide 2. Next and as depicted in FIG. 2c, the masking material 3 is removed through exposure to a corrosive gas. The corrosive gas may comprise $NF_3$ and ay be inserted into the epitaxy reactor after the epitaxy together with a carrier gas (e.g. $H_2$, $N_2$ Ar, etc.). The temperature within the reactor lies in the range of 50 and 500° C. Next and as depicted in FIG. 2d, wave-guide material is applied without prior removal of the substrate from the reactor. Accordingly, the vertical wave-guide 2 and lateral wave-guide 8 are produced.

Figure 3A:
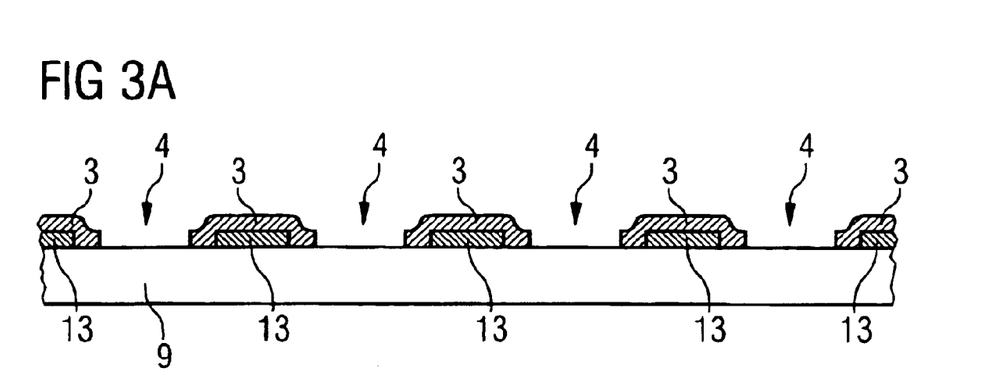
FIGS. 3a–3c depict a schematic presentation of a third embodiment.
Figure 3B:
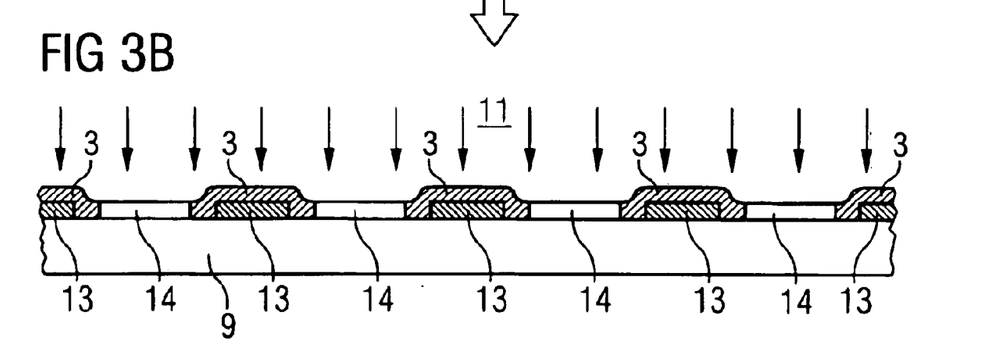
Figure 3C:
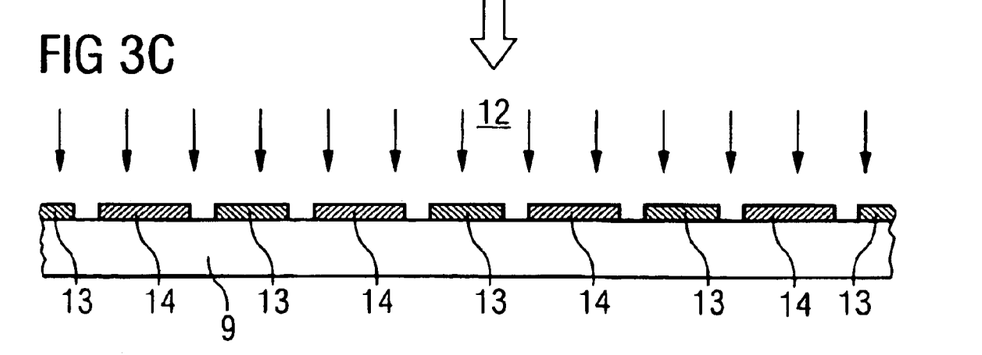

The application of the present method to integrated semiconductor components is depicted in FIGS. 3a–3c. The components may be electrical and optoelectrical. As depicted in FIG. 3a, electrical components 13 may comprise transistors, diodes, amplifiers, and the like. Optoelectronic components 14 (FIG. 2b) may comprise laser diodes, optical amplifiers, light emitting diodes and the like. Returning to FIG. 2a, electrical components 13 are applied on substrate 9 below HF soluble masking layer 3. The masking layer 3 defines windows 4 along the substrate 9. As depicted in FIG. 3b, the optoelectronic components are grown in windows 4, per arrows 11. Thereafter and as depicted in FIG. 3c, the masking layer is removed 2 by introduction of a fluoride combination into the epitaxy reactor. Now, the wafer can be further processed with, for example additional, electrical contacts and the like.

Additionally, the above steps depicted in FIGS. 3a–3c may be effected with application of a thicker masking layer 3 on the electrical components than in areas for the optoelectronic components. A masking layer removal procedure in the epitaxy reactor will remove a layer of masking revealing an area for application of the optoelectronic components while leaving the electronic components protected by a remainder masking layer. This procedure has the advantage of additional protection for the electronic components during growth of the optoelectronic components or other intermediary steps envisioned by one skilled in the art.

Figure 4A:
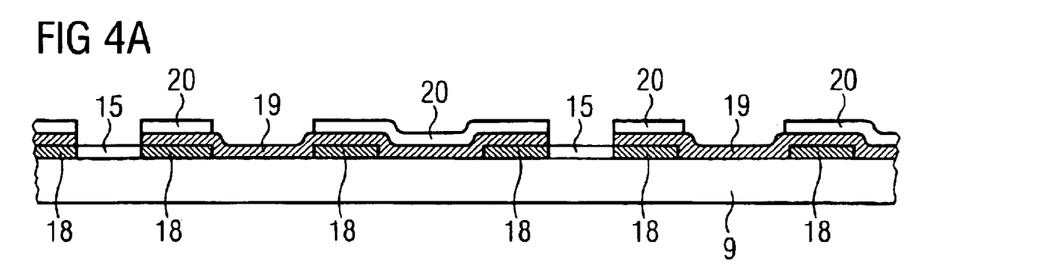
FIGS. 4a–4c depict a schematic presentation of a fourth embodiment of the present invention.
Figure 4B:
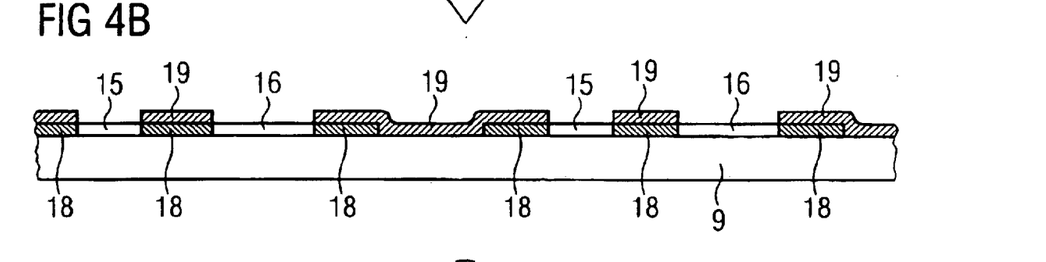
Figure 4C:
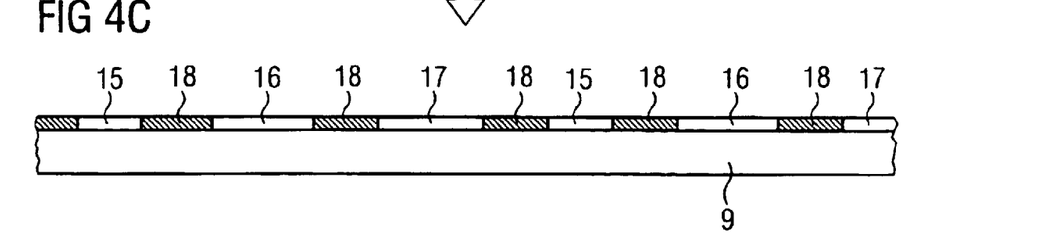

FIGS. 4a–4c depict method steps for producing integrated semiconductor components, wherein first, second and third semiconductor components 15, 16, 17 may be interconnected. These semiconductor components may be the same or of a different type. As depicted in FIG. 4a, epitaxy substrate 9 has a first 18, a second 19, and a third HF soluble masking layer 20 applied thereon. The masks can be of the same or different composition and/or the same or different thickness. Of the masking layers, first mask layer 18 is first applied. This mask layer defines windows where later application of the semiconductor components will be performed. The second masking layer 19, applied next, defines windows where first semiconductor component 15 will be later applied. The third masking layer 20, defines windows where first and second semiconductor components 15 and 16 will be later applied.

As depicted in FIG. 4a, the first semiconductor components 15 are applied on the epitaxial substrate 9. Then, as depicted in FIG. 4b, the third masking layer 20 is removed. In addition, a portion of the second masking layer 19 may be removed. Both removals may be performed by etching, within the epitaxy reactor, by the introduction of a fluoride combination. Next, the second semiconductor components 16 are epitaxially precipitated on the epitaxy substrate 9 in the windows defined by the remaining second masking layer 19. Thereafter and as depicted in FIG. 4c, the remainder of second masking layer 19 is removed by etching within the epitaxy reactor via the introduction induction of a fluoride combination. Next, third semiconductor components 17 are applied in the windows defined by first masking layer 18 and the already applied semiconductor components. These method steps can be enlarged to incorporate any number and types of semiconductor components. Herein, the number of masking layers and removing steps would be similarly enlarged, according to the guidelines presented above, so as to correspond to the increased number and/or type of semiconductor component.

The invention being thus described, it will be obvious that the same may be varied in many ways. Such variations are not to be regarded as a departure from the spirit and scope of the invention, and all such modifications would be obvious to one skilled in the art intended to be included within the scope of the following claims.

I claim:

1. A method of producing laterally integrated semiconductor components, comprising the steps of:
    applying at least one first semiconductor component on an epitaxial substrate;
    layering a mask over said at least one first semiconductor component and said substrate, said mask defining one or more windows to said substrate;
    applying at least one other semiconductor component in at least one of said one or more windows; and
    removing said mask layer by introduction of at least one fluoride based compound into an epitaxy reactor.

2. The method according to claim 1, wherein said mask includes at least one thinner mask portion where said one or more windows are to be defined and at least one thicker mask portion covering said at least one first semiconductor component, and wherein said step of layering comprises removing at least said at least one thinner mask portion so as to expose said one or more windows.

3. The method according to claim 1, wherein each of said steps is performed within the epitaxy reactor.

4. The method according to claim 3, further comprising initially cleaning said substrate within said epitaxy reactor by corrosion of any hydrogen fluoride soluble layers through introduction of at least one fluoride based compound.

5. The method according to claim 1, wherein said step of layering comprises layering N mask layers over said first semiconductor component and said substrate, wherein each of said N mask layers defines at least one window to one or more from a group consisting of an underlying mask layer and said substrate, wherein said mask defines at least one first window to said substrate, wherein N is a natural number, and wherein said step of applying at least one other semiconductor component comprises applying at least one second semiconductor component in said at least one first window.

6. The method according to claim 5, said method further comprising:
    etching at least one of said N mask layers by use of an etchant, such that at least one second window to said substrate is defined; and
    repeating said step of applying at least one other semiconductor component to apply at least one third semiconductor component in said at least one second window.

7. The method of according to claim 6, further comprising:
    repeating said etching step and said step of applying at least one other semiconductor component alternately until at least one Nth window to said substrate is defined an at least one (N+1)th semiconductor component is applied in said at least one Nth window.

8. The method according to claim 7, wherein after said at least one (N+1)th semiconductor component is applied in said at least one Nth window, any remaining mask layers are removed by etching.

9. The method according to claim 7, wherein at least said etching step is performed within the epitaxy reactor.

10. The method according to claim 9, wherein said etchant comprises an unstable fluoride combination which disintegrates into hydrogen fluoride within said epitaxy reactor.

11. The method according to claim 1, wherein said first semiconductor component is an electrical component and said other semiconductor component is an optoelectrical component.

12. The method of claim 1, further comprising: cooling walls of the epitaxy reactor prior to removing said mask layer.

13. A method for producing laterally integrated semiconductor components comprising the steps of:
    applying a mask comprising N masking layers on an epitaxial substrate, wherein each of said N masking layers defines one or more windows for later application of at least one other semiconductor component, wherein said mask defines at least one first window to said substrate, and wherein N is a natural number;
    applying at least one first semiconductor component on said substrate in said at least one first window; and
    etching by use of an etchant at least one of said N masking layers to expose at least one other window to said substrate;
    applying at least one other semiconductor component in said at least one other window; and
    if necessary, repeating said steps of etching at least one of said N masking layers and applying at least one other semiconductor component until at least one Nth semiconductor component is applied in at least one Nth window.

14. The method according to claim 13, wherein after said at least one Nth semiconductor component has been applied, any remaining mask is moved by etching.

15. The method according to claim 13, wherein each of said steps is performed within an epitaxy reactor.

16. The method according to claim 15, wherein said step of etching includes introduction of said etchant into said epitaxy reactor.

17. The method according to claim 16, wherein said N masking layers are hydrogen fluoride soluble masking layers, and wherein said etchant contains fluoride.

18. The method according to claim 17, wherein said etchant comprises an unstable fluoride combination which disintegrates into hydrogen fluoride within said epitaxy reactor.

19. The method according to claim 15, further comprising a step of initially cleaning said substrate within said epitaxy reactor by corrosion of any hydrogen fluoride soluble layers through introduction of at least one fluoride based compound.

20. The method according to claim 13, wherein said at least one first semiconductor component is different from said at least one other semiconductor component.

21. The method according to claim 20, wherein said at least one first semiconductor component is an electrical component and said at least one other semiconductor component is an optoelectronic component.

22. The method according to claim 13, wherein said etchant comprises hydrogen fluoride.

23. The method according to claim 13, wherein said N masking layers comprises masking layers having different thicknesses.

24. The method according to claim 13, wherein said N masking layers comprises masking layers having different compositions.

* * * * *

UNITED STATES PATENT AND TRADEMARK OFFICE
CERTIFICATE OF CORRECTION

PATENT NO. : 6,838,391 B2
DATED : January 4, 2005
INVENTOR(S) : Volker Harle

It is certified that error appears in the above-identified patent and that said Letters Patent is hereby corrected as shown below:

Title page,
Item [56], References Cited, OTHER PUBLICATIONS,
"B. Henle," reference, replace "*On Indium Phosphide & Rel. Materials, U.S. NY; IEEE, Bd.*" with -- *On Idium Phosphide & Rel. Materials, U.S. NY IEEE, Bd.* --
J.P. Harbinson et al.," reference, replace "*J.P. Harbinson et al., "Tungsten Patterning As A Technique*" with -- *J.P. Harbison et al., "Tungsten Patterning As A Technique* --
"JP 02-046407", reference, replace "JP 02-046407, Patent Abstracts of Japan, Veroffentlicung:" with -- JP 02-046407, Patent Abstracts of Japan, Veroffentlichung: --
"Whidden T.K. et al." reference, replace "Whidden T.K. et al.; "*Catalyzed HF Vapor Etcing Of*" with -- Whidden T.K. et al.; "*Catalyzed HF Vapor Etching Of* --
"Wong M. et al.," reference, replace "*Oxide And Oxide Etching Using Vapor-Phase Hydrgoen*" with -- *Oxide And Oxide Etching Using Vapor-Phase Hydrogen* --

Column 5,
Line 29, replace "more from a group consisting of an underlying mask layer" with
-- or more from a group consisting of an underlying mask layer --
Line 51, replace "defined an at least one (N+1)th semiconductor compo-" with
-- defined and at least one (N+1)th semiconductor-compo- --

Column 6,
Line 29, replace "any remaining mask is moved by etching." with -- any remaining mask is removed by etching. --

Signed and Sealed this

Twenty-fourth Day of May, 2005

JON W. DUDAS
*Director of the United States Patent and Trademark Office*